(12) United States Patent
Tan et al.

(10) Patent No.: US 9,159,565 B2
(45) Date of Patent: Oct. 13, 2015

(54) INTEGRATED CIRCUIT SYSTEM WITH BAND TO BAND TUNNELING AND METHOD OF MANUFACTURE THEREOF

(75) Inventors: Shyue Seng Tan, Singapore (SG); Lee Wee Teo, Singapore (SG); Ming Zhu, Shanghai (CN)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/544,747

(22) Filed: Aug. 20, 2009

(65) Prior Publication Data

US 2011/0042757 A1 Feb. 24, 2011

(51) Int. Cl.
H01L 29/76 (2006.01)
H01L 21/336 (2006.01)
H01L 21/265 (2006.01)

(52) U.S. Cl.
CPC ................................ H01L 21/26586 (2013.01)

(58) Field of Classification Search
USPC .................. 257/327, 335, 336, 344, 349, 368, 257/E23.268, E23.269, 402, 404, E21.409; 438/163, 286, 289, 290, 302, 303, 305
See application file for complete search history.

(56) References Cited

U.S. PATENT DOCUMENTS

| | | | |
|---|---|---|---|
| 5,693,955 A | 12/1997 | Goronkin et al. | |
| 7,535,015 B2 | 5/2009 | Ponomarev | |
| 2009/0008631 A1 | 1/2009 | Hurkx et al. | |
| 2009/0026491 A1 | 1/2009 | Booth, Jr. et al. | |
| 2009/0026553 A1 | 1/2009 | Bhuwalka et al. | |
| 2009/0283806 A1* | 11/2009 | Yang et al. | 257/288 |
| 2010/0244148 A1* | 9/2010 | Chaparala et al. | 257/408 |

* cited by examiner

*Primary Examiner* — Tuan N. Quach

(57) ABSTRACT

A method of manufacture of an integrated circuit system includes: providing a semiconductor substrate; implanting a well region, having a first conductivity, on the semiconductor substrate; patterning a gate oxide layer on the well region; implanting a source, having a second conductivity, at an angle for implanting under the gate oxide layer; selectively implanting a dopant pocket, having a third conductivity that is opposite the second conductivity, at the angle for forming the dopant pocket under the gate oxide layer; and implanting a drain, having the third conductivity, for forming a transistor channel asymmetrically positioned under the gate oxide layer.

20 Claims, 5 Drawing Sheets

INTEGRATED CIRCUIT SYSTEM WITH BAND TO BAND TUNNELING AND METHOD OF MANUFACTURE THEREOF

TECHNICAL FIELD

The present invention relates generally to an integrated circuit system, and more particularly to a system for low power integrated circuits that operate with limited voltage and current.

BACKGROUND ART

A field-effect transistor (FET) may be a transistor that relies on an electric field to control the conductivity of a "channel" in a semiconductor material. A FET, like all transistors, may be thought of as a voltage-controlled current source. Some FETs may use a single-crystal semiconductor wafer as the channel, or active region. A terminal in a FET may be one of a gate, a drain, or a source. The voltage applied between gate and source terminals may modulate the current between the source and the drain.

Millions of such FET devices may be connected to form a microprocessor, a memory, or a logic interface chip. As the number of the FETs increases and the available energy is diminished, new approaches must be developed that allow the standard operation with significantly less voltage.

Portable products, such as cellular telephones, personal video players, cameras, camcorders, and portable video games are battery powered. These products must be capable of performing across a wide and reduced voltage range. The physical geometries of these FET devices have not deviated very much while their size has greatly been reduced.

Some of the latest developments in FETs may include High-K/metal gate (HK/MG) FETs may operate between 0.8 and 1.0 volts, Trigate FETs may operate between 0.6 and 0.9 volts, III-V/Ge QW FETs may operate between 0.5 and 0.6 volts, and Sub-threshold-slope Transistors for Electronics with Extremely-low Power (STEEP) transistors may operate between 0.25 and 0.4 volts. Transistors in the STEEP group may include ionization metal oxide semiconductor (IMOS) transistors, Green Field Effect Transistors (gFET), or Tunneling Field Effect Transistors (TFET).

Historically the reduction in gate length geometries in the deep sub-micron semiconductor processes has been accompanied by an increase in leakage current. The goal of the newest generations of deep sub-micron technologies is to shorten gate length technologies, decrease the threshold voltage (Vt) without having an increase in the leakage current ($I_{off}$) or short channel effect (SCE). The SCE can not be controlled in today's technology due to junction sheet resistance and gate tunneling.

Today's conventional devices use diffusion based technologies which may limit the sub-threshold-slope to approximately 60 mV. The applications of today require transistor devices that can scale the Vdd required for reliable operation.

Thus, a need still remains for an integrated circuit system with band to band tunneling. In view of the increasing trend toward higher integration and lower voltage batteries, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a semiconductor substrate; implanting a well region, having a first conductivity, on the semiconductor substrate; patterning a gate oxide layer on the well region; implanting a source, having a second conductivity, at an angle for implanting under the gate oxide layer; selectively implanting a dopant pocket, having a third conductivity that is opposite the second conductivity, at the angle for forming the dopant pocket under the gate oxide layer; and implanting a drain, having the third conductivity, for forming a transistor channel under the gate oxide layer.

The present invention provides an integrated circuit system including: a semiconductor substrate; a well region, having a first conductivity, implanted on the semiconductor substrate; a gate oxide layer patterned on the well region; a source, having a second conductivity, implanted at a first angle; a dopant pocket, having a third conductivity that is opposite the second conductivity, selectively implanted at the first angle; and a drain, having the third conductivity, implanted at a second angle for forming a transistor channel asymmetrically positioned under the gate oxide layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
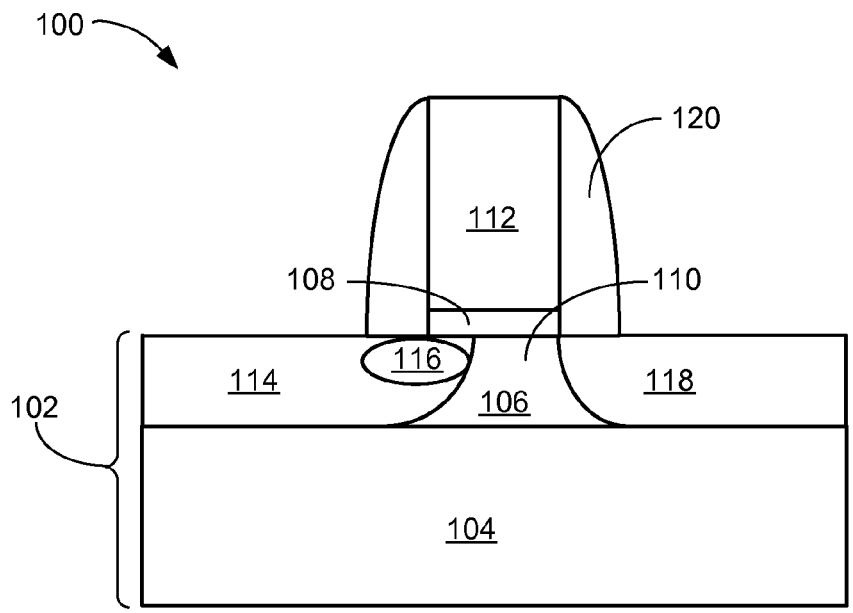
FIG. 1 is a cross-sectional view of an integrated circuit system with band to band tunneling, in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. For expository purposes, the term "horizontal" as used herein is defined as a plane parallel to the plane or surface of the semiconductor wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit system 100 with band to band tunneling, in an embodiment of the present invention. The cross-sectional view of the integrated circuit system 100 depicts a semiconductor substrate 102, such as a semiconductor wafer, having a buried oxide layer 104. A well region 106, such as a P– oxide region, may be formed on the buried oxide layer 104.

A gate oxide layer 108 maybe patterned on the semiconductor substrate 102 for forming a transistor channel 110. A gate electrode 112 may be formed over the gate oxide layer 108. While only a single device is shown it is understood that multiple of the devices may be fabricated concurrently to form the integrated circuit system 100.

A source 114, such as an N+ source region, may be formed on the buried oxide layer 104 adjacent to the well region 106. The source 114 may be formed by an N+ implant that may be applied at an angle that extends the edge of the source 114 under the gate oxide layer 108. It is understood that the position of the edge of the source is an example only and the actual edge position may differ.

A dopant pocket 116, such as an angled implant of C/Si, may be implanted near the edge of the source 114 and the well region 106. The dopant pocket 116 is completely within the source 114. The dopant pocket 116 may include mid-gap dopants that can assist in the enhancement of the band to band tunneling (BTBT) of the device. The implantation of the dopant pocket 116 may cause an asymmetric position of the gate oxide layer 108 relative to the transistor channel 110.

It has been discovered that application of the dopant pocket 116 and the manipulation of gate oxide/Si interface traps (not shown) may enhance the BTBT of the device junction and lead to higher drive current from the device. It has also been discovered that the asymmetric position of the gate oxide layer 108 relative too the transistor channel 110 does not increase the leakage current (Ioff). This may result in a significant reduction in power with reduced threshold voltage (Vth).

The amount of asymmetry of the dopant pocket 116 may be controlled by the angle of the implantation. A typical angle may be in the range of between 10 degrees and 37 degrees from vertical. By forming the dopant pocket 116 on one side of the gate oxide layer 108, a localized area of stronger electric filed may be created to produce high energy carriers which are easily able to overcome the tunneling barriers.

A drain 118, such as a P+ drain region, may be formed on the buried oxide layer 104 adjacent to the well region 106 on the side facing the source 114. The drain 118 may be implanted in a vertical direction, so that the drain 118 does not extend beneath the gate oxide layer 108. The dimensions of the drawing are an example only and are not intended to imply accurate dimensions.

Spacers 120 may be formed adjacent to the gate oxide layer 108 and the gate electrode 112. The spacers 120 are present on the side adjacent to the source 114, and the side adjacent to the drain 118.

In has been discovered that the higher density of gate oxide interface traps may increase BTBT current by increasing the number of high energy carriers therefore increasing the probability of tunneling. Gate oxide interface traps may produce localized areas of strong electric field and create additional tunneling paths to further increase the tunneling probability.

A bias voltage in the range of 0.25V to 1.6V may be sufficient to initiate tunneling, depending on the design goal. The mid-gap dopants may greatly increase the probability of tunneling by providing an intermediate tunneling path, similar to a stepping stone, for the high energy carriers.

Figure 2:
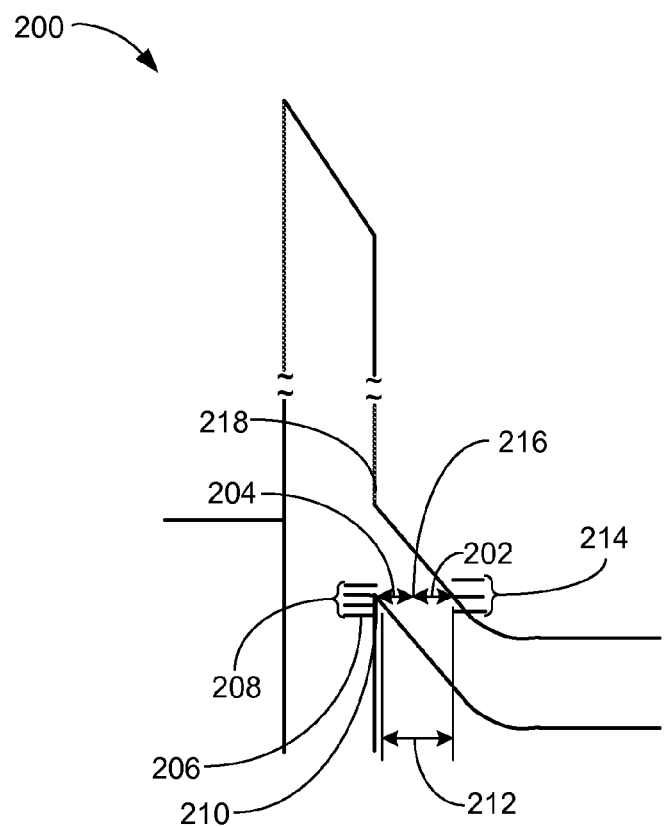
FIG. 2 is an energy band diagram of the integrated circuit system of FIG. 1.

Referring now to FIG. 2, therein is shown an energy band diagram 200 of the integrated circuit system 100, of FIG. 1. The energy band diagram 200 depicts that turning on the integrated circuit system 100 is a function of both reverse biasing and overcoming an energy gap 202. In an embodiment, reverse biasing the integrated circuit system 100 may include of applying a negative voltage on the drain 118, a positive voltage on the source 114, and a positive gate voltage on the gate electrode 112.

The integrated circuit system 100 has the transistor channel 110, of a P– type of silicon, and the source 114, of a N+ type implant which makes up the reverse-biased diode. A random exchange of electrons and holes may occur between the transistor channel 110 and the dopant pocket 116 under unbiased conditions as indicated by an exchange region 204. The exchange region 204 may increase the possibility of the band to band tunneling (BTBT) through the device.

It is understood that the description of the integrated circuit system 100 having the well region 106 of the P– type of silicon is an example only and other options may be evident to one of ordinary skill in the art. It is further understood that the energy band diagram of FIG. 2 is an example used to demonstrate the effects of the present invention and is not implied as a limitation in any way.

As it is known, tunneling in reverse-biased diodes involves p-side valence band electrons passing through a conduction barrier to empty states at the same energy level in the conduction band on the n-side. This process is exemplified by the transition of electrons through the exchange region 204 and the energy gap 202.

In FIG. 2, a tunneling electron 206, located among filled states 208 near a p-side valence bond 210, tunnels through a conduction barrier 212 to an n-side conduction band 214. The energy gap 202 also contributes to tunneling in the integrated circuit system 100. The greater the gap energy delta, the more reverse-biasing needed to turn on the device. Conversely, a lesser energy gap delta requires less reverse-biasing needed to turn on the device.

The presence of the dopant pocket 116, of FIG. 1, reduces the physical distance and therefore the threshold of the conduction barrier 212. The presence of the mid-gap dopant and the dopant pocket 116 also provides an intermediate energy state 216 for the tunneling electron 206 and aids in the crossing of the conduction barrier 212.

Without tunneling, the tunneling electron 206 can only reach the n-side conduction band 214 by gaining enough energy to reach a p-side conduction band 218. The number of the tunneling electrons 206 which tunnel through the conduction barrier 212 is a function of the energy gap 202 and amount of reverse biasing (not shown).

It has been discovered that the formation of the intermediate energy state and the manipulation of the interface states, between the gate oxide layer and the well region, may increase the saturation drive current (Idsat) by six to eight times the level currently known in the art.

Figure 3:
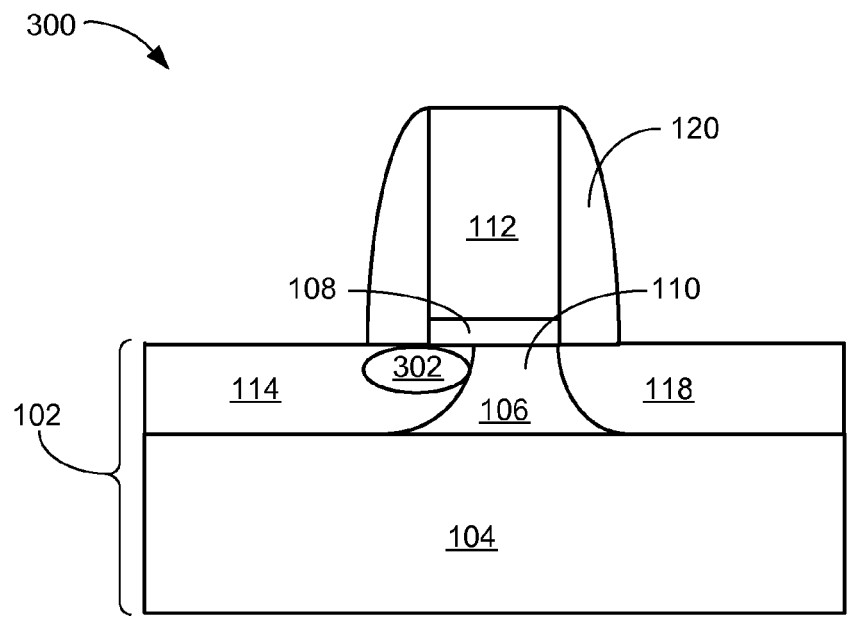
FIG. 3 is a cross-sectional view of an integrated circuit system with band to band tunneling, in an alternative embodiment of the present invention.

Referring now to FIG. 3, therein is shown a cross-sectional view of an integrated circuit system 300 with band to band tunneling, in an alternative embodiment of the present invention. The cross-sectional view of the integrated circuit system 300 depicts the semiconductor substrate 102, such as a semiconductor wafer, having a buried oxide layer 104. The well region 106, such as a P– oxide region, may be formed on the buried oxide layer 104.

The gate oxide layer 108 maybe patterned on the semiconductor substrate 102 for forming the transistor channel 110. The gate electrode 112 may be formed over the gate oxide layer 108. While only a single device is shown it is understood that multiple of the devices may be fabricated concurrently to form the integrated circuit system 100.

The source 114, such as an N+ source region, may be formed on the buried oxide layer 104 adjacent to the well region 106. The source 114 may be formed by an N+ implant that may be applied at an angle that extends the edge of the source 114 under the gate oxide layer 108. It is understood that the position of the edge of the source is an example only and the actual edge position may differ.

A dopant pocket 302, such as a P+ pocket with mid-gap dopants, may be implanted near the edge of the source 114 and the well region 106. The dopant pocket 302 may include mid-gap dopants that can assist in the enhancement of the band to band tunneling (BTBT) of the device. The implantation of the dopant pocket 302 may cause an asymmetric position of the gate oxide layer 108 relative too the transistor channel 110.

It has been discovered that application of the dopant pocket 302 and the manipulation of gate oxide/Si interface traps (not shown) may enhance the BTBT of the device junction and lead to higher drive current from the device. It has also been discovered that the asymmetric position of the gate oxide layer 108 relative too the transistor channel 110 does not increase the leakage current (Ioff). This may result in a significant reduction in power with reduced threshold voltage (Vth).

The drain 118, such as a P+ drain region, may be formed on the buried oxide layer 104 adjacent to the well region 106 on the side facing the source 114. The drain 118 may be implanted in a vertical direction, so that the drain 118 does not extend beneath the gate oxide layer 108. The dimensions of the drawing are an example only and are not intended to imply accurate dimensions.

The spacers 120 may be formed adjacent to the gate oxide layer 108 and the gate electrode 112. The spacers 120 are present on the side adjacent to the source 114, and the side adjacent to the drain 118.

Figure 4:
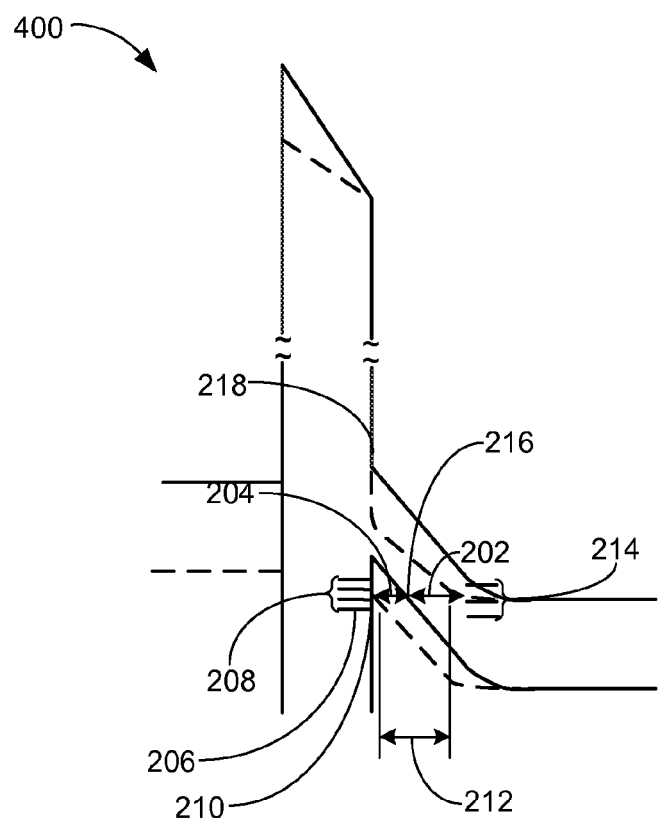
FIG. 4 is an energy band diagram of the integrated circuit system of FIG. 3.

Referring now to FIG. 4, therein is shown an energy band diagram 400 of the integrated circuit system 300, of FIG. 3. The energy band diagram 400 depicts that turning on the integrated circuit system 100 is a function of both reverse biasing and overcoming the energy gap 202. In an embodiment, reverse biasing the integrated circuit system 100 may include of applying a negative voltage on the drain 118, a positive voltage on the source 114, and a positive gate voltage on the gate electrode 112.

The integrated circuit system 100 has the transistor channel 110, of a P– type of silicon, and the source 114, of a N+ type implant which makes up the reverse-biased diode. A random exchange of electrons and holes may occur between the transistor channel 110 and the dopant pocket 116 under unbiased conditions as indicated by the exchange region 204. The exchange region 204 may increase the possibility of the band to band tunneling (BTBT) through the device.

It is understood that the description of the integrated circuit system 100 having the well region 106 of the P– type of silicon is an example only and other options may be evident to one of ordinary skill in the art. It is further understood that the energy band diagram of FIG. 2 is an example used to demonstrate the effects of the present invention and is not implied as a limitation in any way.

As it is known, tunneling in reverse-biased diodes involves p-side valence band electrons passing through a conduction barrier to empty states at the same energy level in the conduction band on the n-side. This process is exemplified by the transition of electrons through the exchange region 204 and the energy gap 202.

In FIG. 4, the tunneling electron 206, located among the filled states 208 near the p-side valence bond 210, tunnels through the conduction barrier 212 to the n-side conduction band 214. The energy gap 202 also contributes to tunneling in the integrated circuit system 100. The greater the gap energy delta, the more reverse-biasing needed to turn on the device. Conversely, a lesser energy gap delta requires less reverse-biasing needed to turn on the device.

The presence of the dopant pocket 302, of FIG. 3, reduces the physical distance and therefore the threshold of the conduction barrier 212. The presence of the mid-gap dopant and the dopant pocket 302 also provides the intermediate energy state 216 for the tunneling electron 206 and aids in the crossing of the conduction barrier 212.

Without tunneling, the tunneling electron 206 can only reach the n-side conduction band 214 by gaining enough energy to reach the p-side conduction band 218. The number of the tunneling electrons 206 which tunnel through the conduction barrier 212 is a function of the energy gap 202 and amount of reverse biasing (not shown).

It has been discovered that the formation of the intermediate energy state, the heavily doped P+ and N+ interface, and the manipulation of the interface states, between the gate oxide layer and the well region, may increase the saturation drive current (Idsat) by six to eight times the level currently known in the art.

Figure 5:
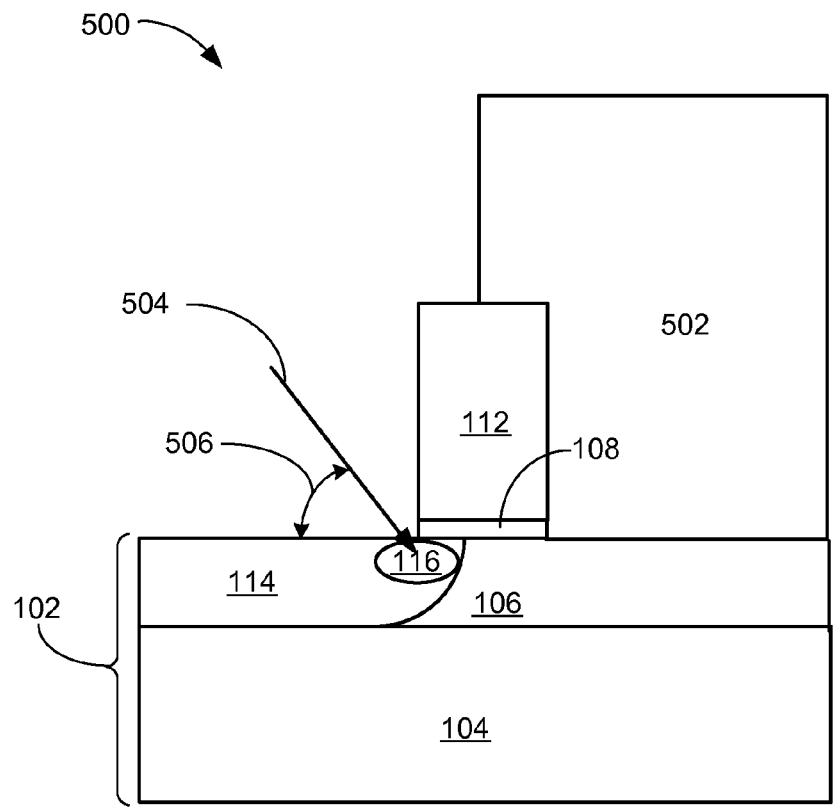
FIG. 5 is a cross-sectional view of an integrated circuit system in a dopant pocket implant phase of manufacturing.

Referring now to FIG. 5, therein is shown a cross-sectional view of an integrated circuit system 500 in a dopant pocket implant phase of manufacturing. The cross-sectional view of the integrated circuit system 500 depicts the semiconductor substrate 102, such as a semiconductor wafer, having the buried oxide layer 104. The well region 106, such as a P− oxide region, may be formed on the buried oxide layer 104.

The gate oxide layer 108 maybe patterned on the semiconductor substrate 102. The gate electrode 112 may be formed over the gate oxide layer 108. While only a single device is shown it is understood that multiple of the devices may be fabricated concurrently to form the integrated circuit system 100. A first mask layer 502, such as a nitride poly hard mask, may be formed on the gate electrode 112 and the well region 106 to block ion implant in the covered regions.

The source 114, such as an N+ source region, may be formed on the buried oxide layer 104 adjacent to the well region 106 by an N+ ion implant 504 at an angle 506 of between 30 and 60 degrees. The source 114 may be formed by the N+ ion implant 504 that may be applied at the angle 504 in order to extend the edge of the source 114 under the gate oxide layer 108. It is understood that the position of the edge of the source is an example only and the actual edge position may differ.

It is understood that the angle 506 of the N+ ion implant 504 and the selective implant of the dopant pocket 116. may also penetrate the gate oxide layer 108 creating interface states (not shown). Manipulation of these interface states may be performed by a subsequent thermal annealing process as well as a formed gas (FG) anneal.

The dopant pocket 116, such as a mid-gap dopant pocket, may be selectively implanted near the edge of the source 114 and the well region 106. The dopant pocket 116 may include mid-gap dopants that can assist in the enhancement of the band to band tunneling (BTBT) of the device. The implantation of the dopant pocket 116 may cause an asymmetric position of the gate oxide layer 108 relative too the transistor channel 110.

It has been discovered that application of the dopant pocket 116 and the manipulation of gate oxide/Si interface traps (not shown) may enhance the BTBT of the device junction and lead to higher drive current from the device. It has also been discovered that the asymmetric position of the gate oxide layer 108 relative too the transistor channel 110 does not increase the leakage current (Ioff). This may result in a significant reduction in power with reduced threshold voltage (Vth).

Figure 6:
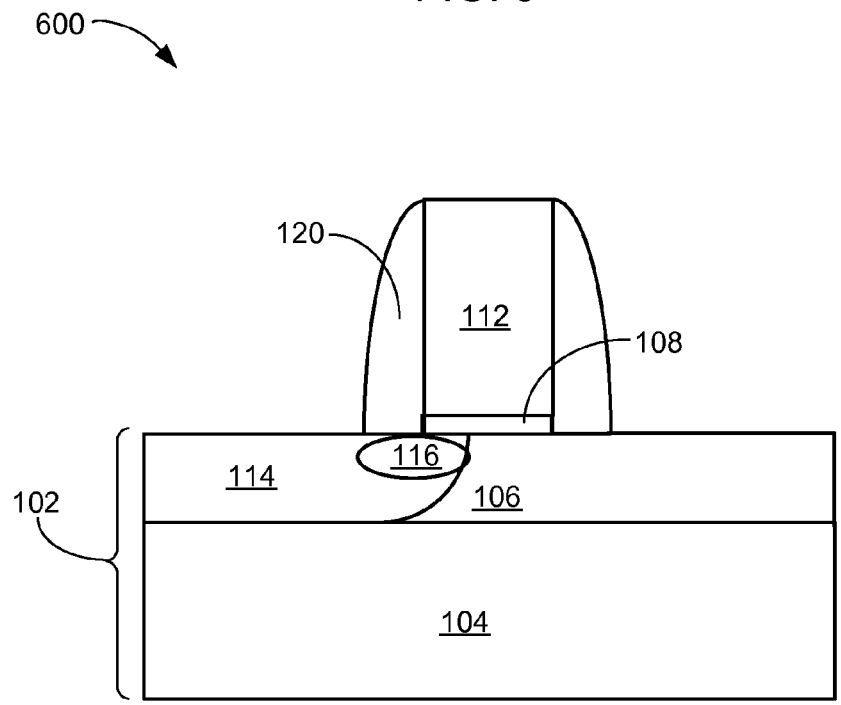
FIG. 6, is a cross-sectional view of an integrated circuit system in a spacer forming phase of manufacturing.

Referring now to FIG. 6, therein is shown a cross-sectional view of an integrated circuit system 600 in a spacer forming phase of manufacturing. The cross-sectional view of the integrated circuit system 600 depicts the spacers 120, such as an oxide or other insulator, formed on the gate oxide layer 108, the gate electrode 112, the well region 106, and the source 114. The first mask layer 502, of FIG. 5, has been removed prior to forming the spacers 120.

The spacers 120 can be formed adjacent outer vertical edges of the gate electrode 112 and outer vertical edges of the gate oxide layer 108. The transistor channel 110, formed in a later step, can preferably be covered by the spacers 120. The spacers 120 can provide isolation of the transistor channel 110 for further processing.

Figure 7:
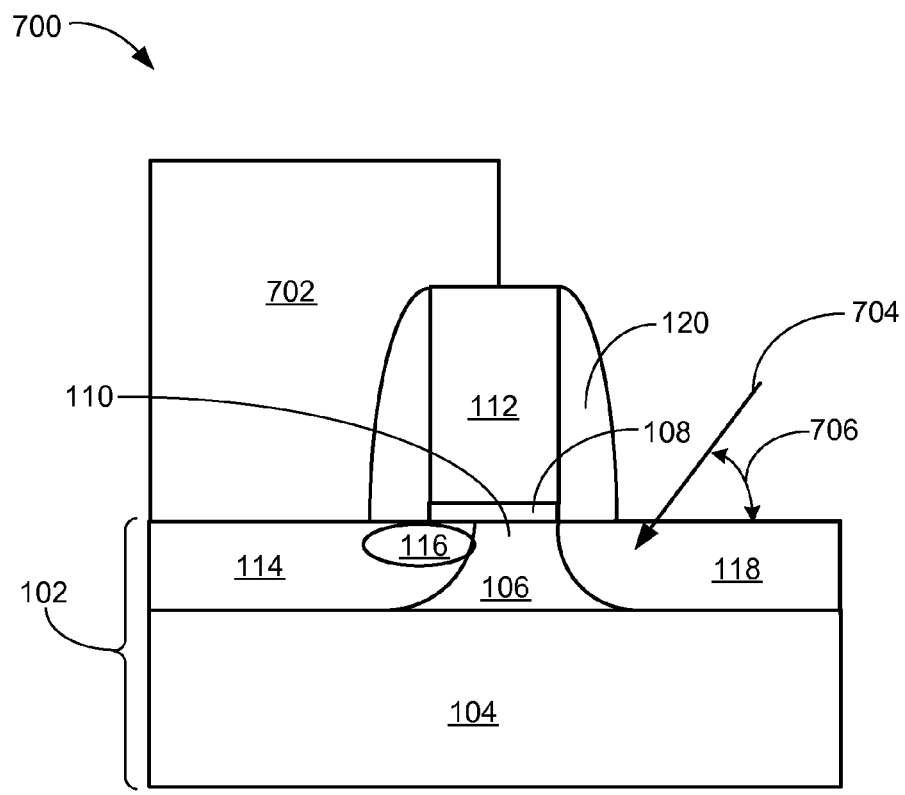
FIG. 7 is a cross-sectional view of an integrated circuit system in a drain forming phase of manufacturing.

Referring now to FIG. 7, therein is shown a cross-sectional view of an integrated circuit system 700 in a drain forming phase of manufacturing. The cross-sectional view of the integrated circuit system 700 depicts a second mask layer 702, such as a nitride poly hard mask, deposited over the source 114, the spacer 120 and the gate electrode 112.

The drain 118, such as an P+ drain region, may be formed on the buried oxide layer 104 adjacent to the well region 106 by an P+ ion implant 704 at an angle 706 of between 30 and 60 degrees. The drain 118 may be formed by the P+ ion implant 704 that may be applied at the angle 704 to extend the edge of the drain 118 under the spacer 120. It is understood that the position of the edge of the drain is an example only and the actual edge position may differ.

While the gate electrode 112 may be exposed to the P+ ion implant 704 and the N+ ion implant 504, of FIG. 5, a thermal annealing process may be used to cancel the effects of the implant. In a further embodiment the first mask layer 502, of FIG. 5, and the second mask layer 702 may cover the gate electrode 112 in order to block the implants.

Figure 8:
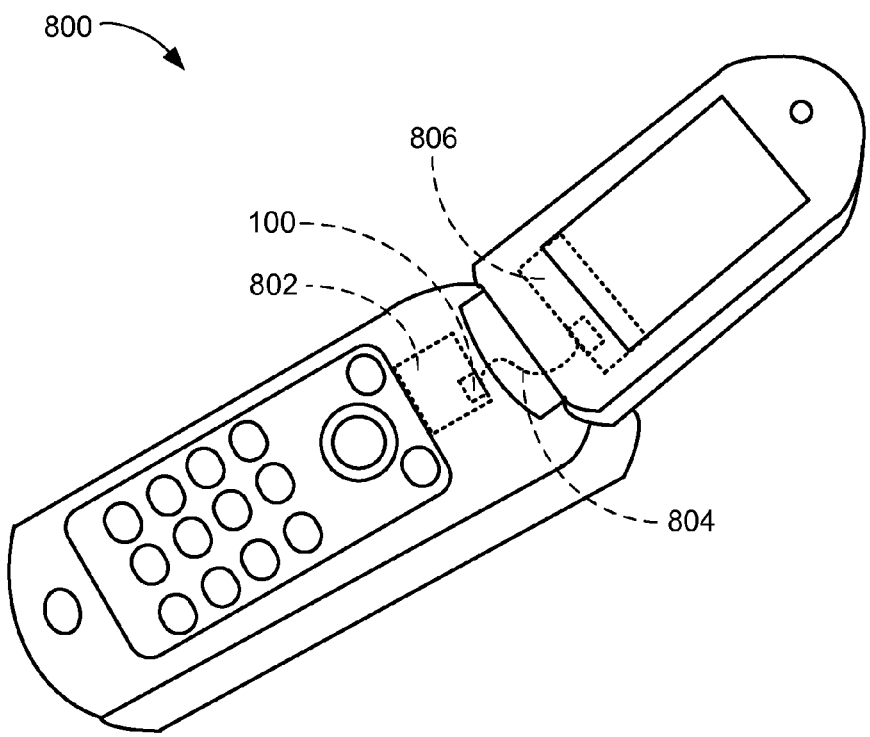
FIG. 8 is a plan view of an electronic device having the integrated circuit system in an embodiment of the present invention.

Referring now to FIG. 8, therein is shown a plan view of an electronic device 800 having the integrated circuit system 100 in an embodiment of the present invention. The plan view of the electronic device 800 depicts a first integrated circuit 802, such as a microprocessor, having the integrated circuit system 100.

A conductive link 804, such as a flex circuit, a cable, printed circuit board traces, or a combination thereof, may be coupled between the first integrated circuit 802 and a second integrated circuit 806. The second integrated circuit 806 may be a display controller, a camera chip, an audio controller, or a combination thereof.

The integrated circuit system 100 used in the first integrated circuit 802 and the second integrated circuit 806 may require less energy to operate and allow operation over a broader range of voltage sources. The results will include longer battery life and less heat generated by the first integrated circuit 802 and the second integrated circuit 806.

Figure 9:
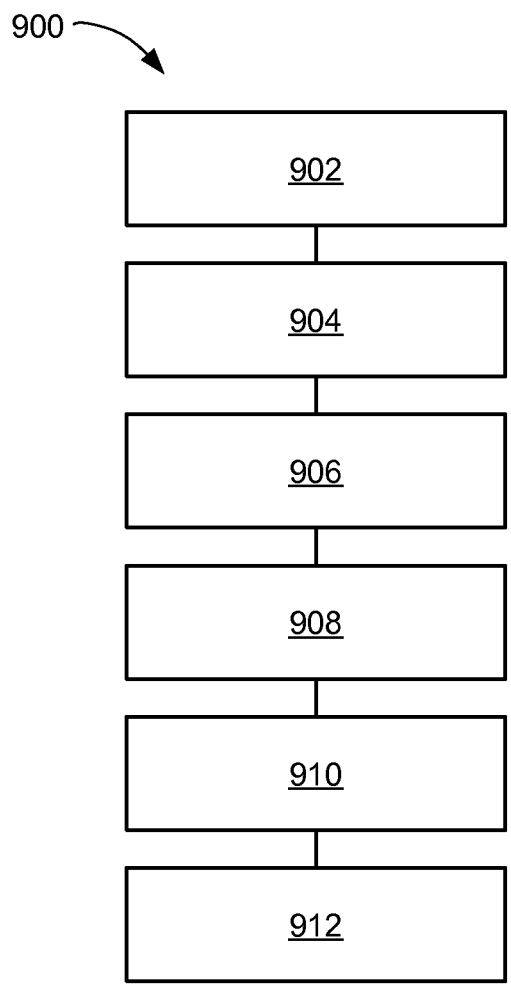
FIG. 9 is a flow chart of a method of manufacture of an integrated circuit system in an embodiment of the present invention.

Referring now to FIG. 9, therein is shown a flow chart of a method 900 of manufacture of an integrated circuit system in an embodiment of the present invention. The method 900 includes: providing a semiconductor substrate in a block 902; implanting a well region, having a first conductivity, on the semiconductor substrate in a block 904; patterning a gate oxide layer on the well region in a block 906; implanting a source, having a second conductivity, at an angle for implanting under the gate oxide layer in a block 908; selectively implanting a dopant pocket, having a third conductivity that is opposite the second conductivity, at the angle for forming the dopant pocket under the gate oxide layer in a block 910; and implanting a drain, having the third conductivity, for forming a transistor channel under the gate oxide layer in a block 912.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit systems fully compatible with conventional manufacturing methods or processes and technologies. Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a semiconductor substrate;
   implanting a well region, having a first conductivity, on the semiconductor substrate;
   patterning a gate oxide layer on the well region;
   implanting a source, having a second conductivity, at a first angle;
   selectively implanting a dopant pocket completely within the source, having a third conductivity that is opposite the second conductivity, with mid-gap dopants at the first angle; and
   implanting a drain, having the third conductivity, at a second angle for forming a transistor channel asymmetrically positioned under the gate oxide layer.

2. The method as claimed in claim 1 further comprising forming a gate electrode over the gate oxide layer.

3. The method as claimed in claim 1 wherein selectively implanting the dopant pocket includes implanting mid-gap dopants, P+dopants, or a combination thereof.

4. The method as claimed in claim 1 further comprising tunneling a tunneling electron across a conduction barrier by reverse biasing the transistor channel.

5. The method as claimed in claim 1 further comprising forming an intermediate energy state in the conduction barrier.

6. A method of manufacture of an integrated circuit system comprising:
   providing a semiconductor substrate having a buried oxide layer;
   implanting a well region, having a first conductivity, on the semiconductor substrate, in which the well region is on the buried oxide layer;
   patterning a gate oxide layer on the well region;
   implanting a source, having a second conductivity, at a first angle for implanting under the gate oxide layer;
   selectively implanting a dopant pocket completely within the source, having a third conductivity that is opposite the second conductivity, at the first angle for forming the dopant pocket including mid-gap dopants under the gate oxide layer; and
   implanting a drain, having the third conductivity, at a second angle for forming a transistor channel asymmetrically positioned under the gate oxide layer.

7. The method as claimed in claim 6 further comprising forming a gate electrode over the gate oxide layer including forming spacers on a vertical edge of the gate electrode and the gate oxide layer.

8. The method as claimed in claim 6 wherein selectively implanting the dopant pocket includes implanting mid-gap dopants, P+dopants, or a combination thereof including forming interface states between the gate oxide layer and the well region.

9. The method as claimed in claim 6 further comprising tunneling a tunneling electron across a conduction barrier by reverse biasing the transistor channel including crossing from filled states near a p-side valence bond to an n-side conduction band.

10. The method as claimed in claim 6 further comprising forming an intermediate energy state in the conduction barrier including forming an exchange region, in the conduction barrier, by the mid-gap dopants.

11. An integrated circuit system comprising:
    a semiconductor substrate;
    a well region, having a first conductivity, implanted on the semiconductor substrate;
    a gate oxide layer patterned on the well region;
    a source, having a second conductivity, implanted at a first angle;
    a dopant pocket, having a third conductivity that is opposite the second conductivity, completely within the source and selectively implanted with mid-gap dopants at the first angle; and
    a drain, having the third conductivity, implanted at a second angle for forming a transistor channel asymmetrically positioned under the gate oxide layer.

12. The system as claimed in claim 11 further comprising a gate electrode over the gate oxide layer.

13. The system as claimed in claim 11 wherein the dopant pocket selectively implanted includes mid-gap dopants, P+dopants, or a combination thereof implanted under the gate oxide layer.

14. The system as claimed in claim 11 wherein the transistor channel is reverse biased to launch by a tunneling electron across a conduction barrier.

15. The system as claimed in claim 11 wherein the transistor channel includes an intermediate energy state for crossing the conduction barrier.

16. The system as claimed in claim 11 further comprising:
    a buried oxide layer on the semiconductor substrate with the well region formed thereon; and
    wherein:
    the source is implanted under the gate oxide layer; and
    the dopant pocket and mid-gap dopants under the gate oxide layer.

17. The system as claimed in claim 16 further comprising a gate electrode over the gate oxide layer includes spacers on a vertical edge of the gate electrode and the gate oxide layer.

18. The system as claimed in claim 16 wherein the dopant pocket selectively implanted includes mid-gap dopants, P+dopants, or a combination thereof implanted including interface states between the gate oxide layer and the well region formed.

19. The system as claimed in claim 16 wherein the transistor channel reverse biased for tunneling by a tunneling electron across a conduction barrier includes the tunneling electron in filled states near a p-side valence bond launched to an n-side conduction band.

20. The system as claimed in claim 16 wherein the transistor channel includes an intermediate energy state for crossing the conduction barrier including an exchange region formed, in the conduction barrier, by the mid-gap dopants.

* * * * *